United States Patent [19]

Kawabata et al.

[11] Patent Number: 4,558,396
[45] Date of Patent: Dec. 10, 1985

[54] DISPLAY DEVICE FOR PORTABLE TYPE ELECTRICAL EQUIPMENT

[75] Inventors: Yoshimasa Kawabata, Yokohama; Susumu Otsuki, Yamato, both of Japan

[73] Assignee: Matsushita Electric Industrial Co., Ltd., Osaka, Japan

[21] Appl. No.: 517,379

[22] Filed: Jul. 26, 1983

[30] Foreign Application Priority Data

Jul. 29, 1982 [JP]  Japan .......................... 57-115771[U]

[51] Int. Cl.[4] .......................................... H05K 05/02
[52] U.S. Cl. ................................. 361/399; 340/700;
340/815.01; 340/815.14; 361/395; 361/408;
361/415; 455/100; 455/347; 455/351
[58] Field of Search ............... 340/765, 762, 705, 711,
340/717, 815.14; 324/171, 780, 114, 76 R, 76 A,
160, 103; 455/347, 351, 100; 361/390–417;
350/332–344, 339 R; 364/560–563, 411–415,
708

[56] References Cited

U.S. PATENT DOCUMENTS

| | | | |
|---|---|---|---|
| 3,363,957 | 1/1968 | Basch | 312/214 |
| 4,012,117 | 3/1977 | Lazzery | 350/160 LC |
| 4,334,190 | 6/1982 | Sochaczevski | 324/171 |
| 4,367,467 | 1/1983 | Emile, Jr. | 340/765 |
| 4,395,601 | 7/1983 | Köpke et al. | 179/179 |

Primary Examiner—R. R. Kucia
Attorney, Agent, or Firm—Spencer & Frank

[57] ABSTRACT

A display device for electrical equipment includes a casing for the equipment, a transparent plate mounted in the casing, a display panel positioned in the casing inwardly of the transparent plate, a single resilient connector received in a recess formed in the casing, and a printed board securely held in the casing by means of fastening members. The display panel is disposed adjacent an end of the printed board and extends in the direction perpendicular to the plane of the printed board. The resilient connector serves to electrically connect the printed board to the display panel and has an elongated rod shape and a channel-shaped cross-section.

9 Claims, 10 Drawing Figures

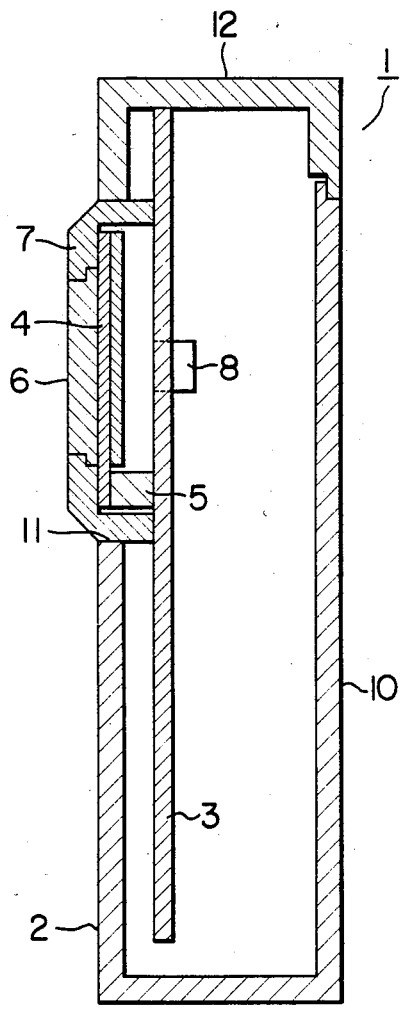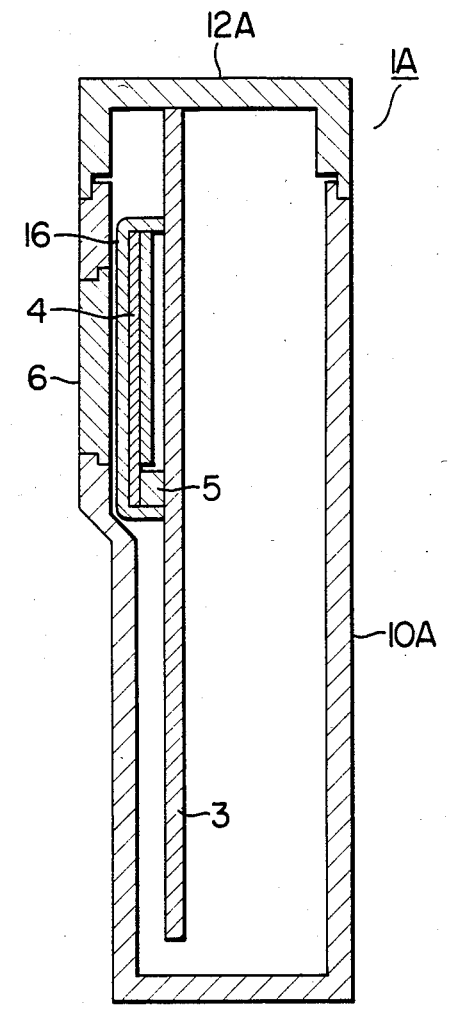

4,558,396

DISPLAY DEVICE FOR PORTABLE TYPE ELECTRICAL EQUIPMENT

BACKGROUND OF THE INVENTION

This invention relates to a display device for portable type electrical equipment.

Calling-type wireless equipment in which a phone number is displayed upon calling, is known. In prior display devices of this type, indications, such as numerals, have been displayed on a front surface 2 of a casing 10, as shown in FIG. 1. The same display device is also shown in FIGS. 2 and 3, in which a display panel 4 is disposed in parallel to the front surface 2 and faces a printed board 3, which is electrically connected to the display panel 4 by means of a connector 5 or conducting wires. The display panel 4 is held stationary by inserting projections 8 of a holder 7 into apertures 9 of the printed board 3 in a snapping manner, and the printed board 3, as well as the associated parts, is received in the casing 10 with the holder 7 projecting beyond a notch 11 on the front surface of the casing 10. Thereafter, a cover 12 is fitted in the casing 10 to which the printed board 3 has been secured by inserting spring pins 15 through apertures 14 formed in leg portions 13 of the cover 12 as well as through the corresponding apertures 9 in the printed board. The holder 7 for the display panel 4 is also provided with a transparent plate 6. Thus, the display panel 4 is disposed on the front surface of the casing parallel to the printed board 3 in which a control circuit and the like is mounted. As a result, when such a display device is worn on clothing of a user, it is difficult to read the indications represented on the display panel. In addition, as the cover 12 and the holder 7, respectively, are separately fitted onto the casing 10 to provide many fitting portions involving so many gaps, an undesirable external appearance is presented.

Display devices, as shown in FIG. 4, have also been proposed in which the transparent plate 6 is mounted to a portion formed integrally with the casing 10A. In this construction, many fitting portions can be dispensed with to improve the external appearance of the display device, but the cover 12A is so large in size to stand out clearly from the remaining portion of the display device, so that the entire display device looks large-sized although it is thin. In addition, the display device needs holder 16 for supporting the display panel 4.

In either type of display devices, a connector 5, in the form of a rectangular parallel pipe for electrically connecting the printed board to the display panel, is formed of a rubber-based material and is interposed between the display panel 4 and the printed board 3, whereupon possible deformation of the connector 5 would make such electrical connection unstable, as shown in FIGS. 5 and 6. Thus, control of the size and position of such a connector 5 is quite troublesome.

SUMMARY OF THE INVENTION

It is an object of the invention to provide a display device for portable-type electrical equipments, which device obviates the drawbacks involved in prior display devices, in particular, in the display section thereof in which device indications, such as numerals, are displayed on a surface, for example, in a top surface of a casing which is small in area.

According to the invention, electrical connection between a display panel and a printed board can be assured and the display panel can be stably held by a shock absorbing material. In addition, the display device according to the invention is hardly influenced by pressures acting on surfaces of the casing and is hardly charged with static electricity.

BRIEF EXPLANATION OF THE DRAWINGS

FIG. 3 is an elevational, sectional view of the display device as shown in FIG. 1;

FIG. 4 is an elevational, sectional view of another prior display device;

DESCRIPTION OF THE PREFERRED EMBODIMENT

The invention relates to a display device for portable type electrical equipment, said device comprising a transparent plate mounted on a casing for containing the equipment, a display panel supported inwardly of said transparent plate, a connector received in a recess formed along the interior of the casing, and a printed board fixed in the casing by means of fastening members, said display panel being disposed transversely to the surface of the printed board and adjacent to an end thereof, said printed board being electrically connected to said display panel by means of said connector.

The invention will become apparent hereinbelow from the detailed explanation of an embodiment thereof with reference to the accompanying drawings.

Figure 1:
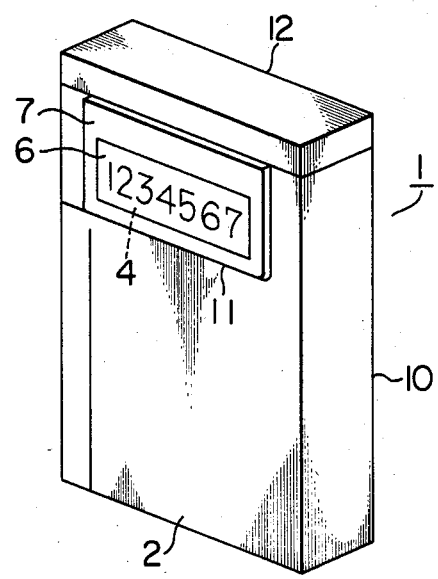
FIG. 1 is a perspective view of a prior display device.
Figure 2:
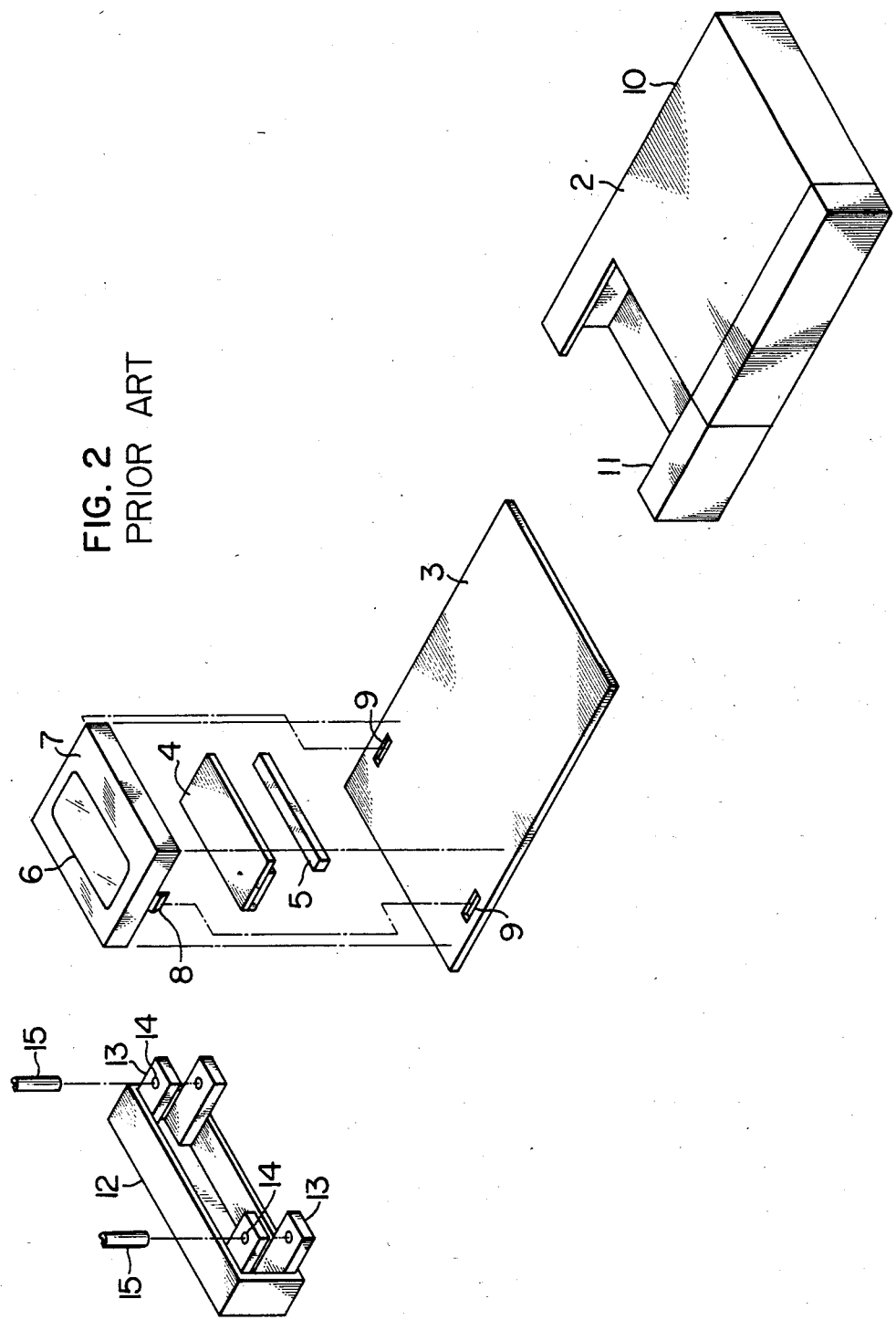
FIG. 2 is an exploded, perspective view of the display device as shown in FIG. 1.
Figure 5:
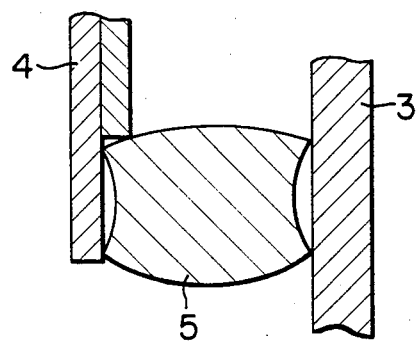
FIGS. 5 and 6 are enlarged, sectional views showing the positional relationship between a display panel, a printed board and a connector in the prior display devices as shown in FIGS. 1 and 4.
Figure 6:
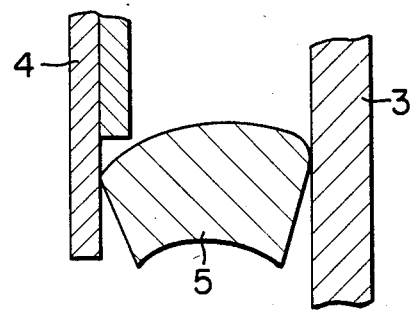
Figure 7:
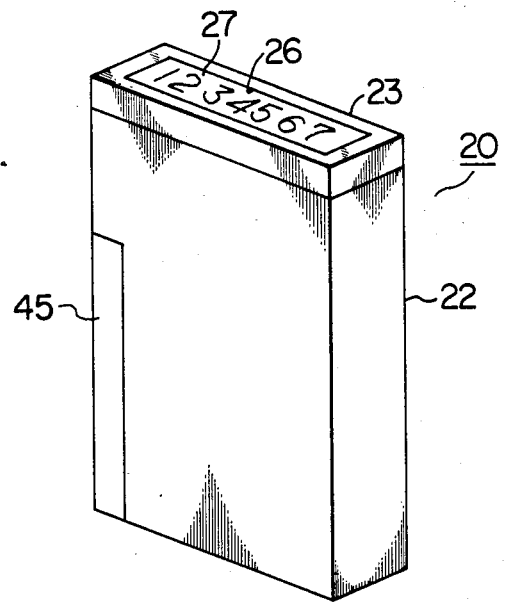
FIG. 7 shows a display device according to an embodiment of the invention exploded, perspective view of the display device shown in FIG. 8.
Figure 8:
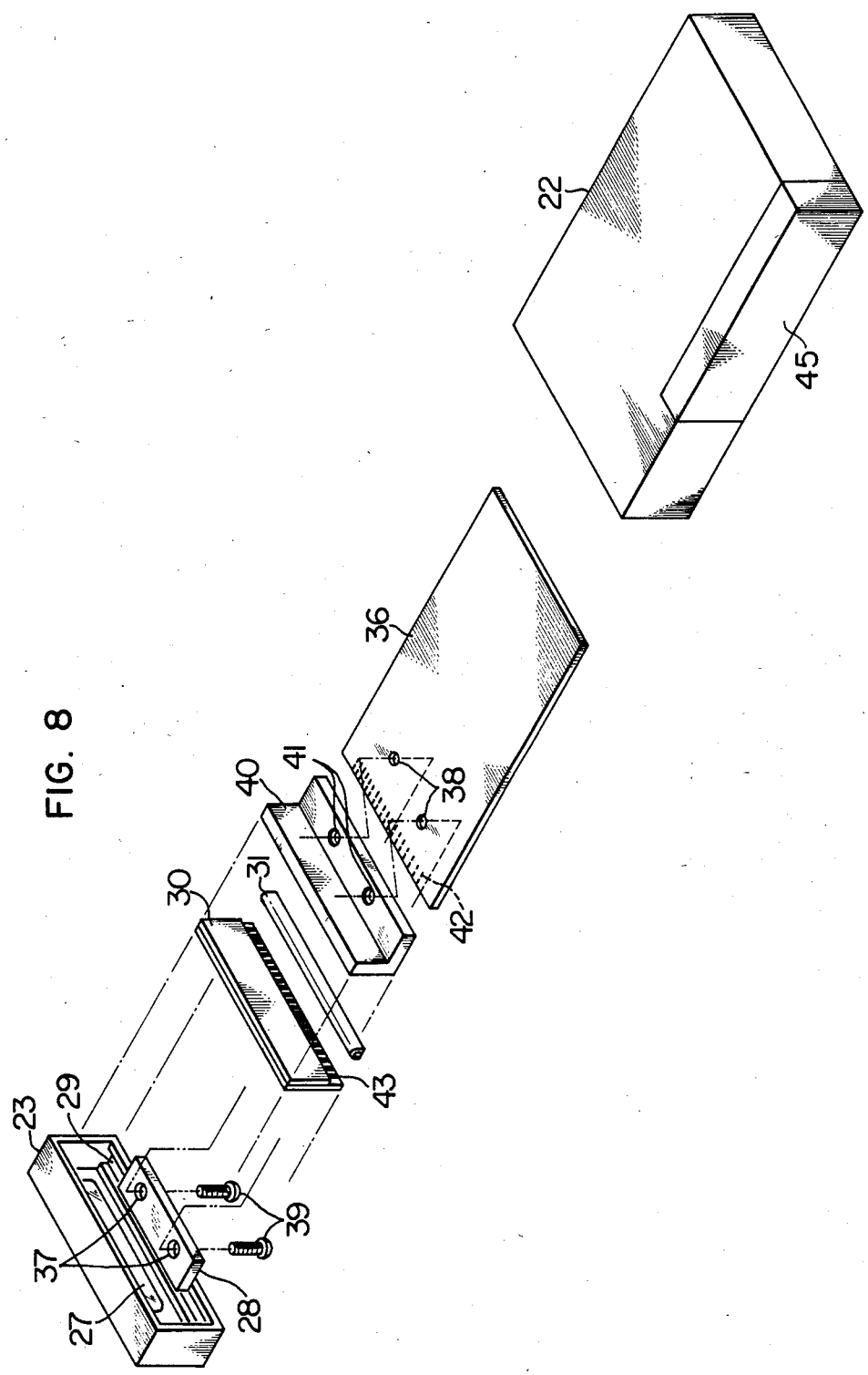
Figure 9:
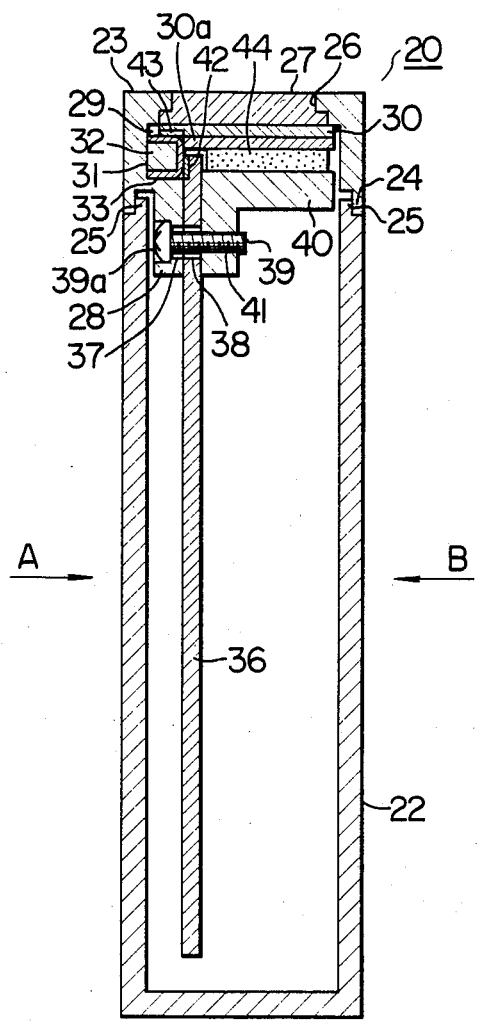
FIG. 9 is an elevational, sectional view of the display device shown in FIGS. 7 and 8.
Figure 10:
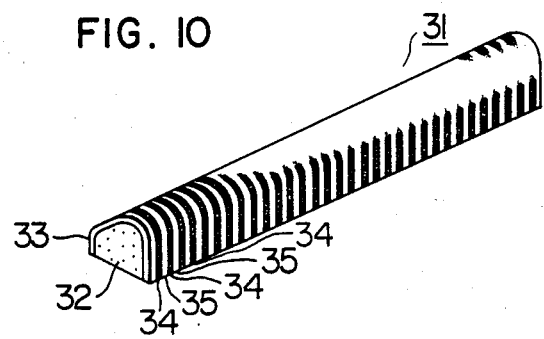
FIG. 10 is a perspective view of a connector used for the display device of the invention.

Referring to FIGS. 7 to 9 of the drawings, a display device 20 includes a flat-shaped casing consisting of a casing body 22 and a cover 23 provided at the top end of the casing body 22. As shown in FIG. 9, a projection 24, circumferentially formed at the open end of the cover 23, is matingly fitted on a stepped portion 25, circumferentially formed at the top end of the casing body 22. The cover 23 is provided in a face plate portion thereof, i.e., at its top end surface, with a window 26, in which a transparent plate 27 made of a synthetic resin is mounted. The cover 23 is also provided with a leg portion 28, which is disposed inwardly of the longer side of the cover at the open end thereof, and a recess 29 is defined along the interior of the cover 23 of the casing upwardly and inwardly of the leg portion 28. A display panel 30 is positioned inwardly of the transparent plate 27 which has been mounted on the cover 23, and a connector 31 is received between the display panel 30 and the top surface of the leg portion 28 in the recess 29. The connector 31 is in the form of an elongated rod and, has a channel-shaped cross-section, and comprises a rod-like core 32 and an electrically conductive envelope 33 cross-section which covers the core 32, on which envelope 33 are alternately arranged conducting sections 34 and insulating sections 35. The core 32 is formed of a resilient material having a lower hardness than that of the envelope 33. A printed board 36 is secured to the leg portion 28 of the cover 23 by means of a short leg 40B of a holder 40 having an L-shaped cross-section with a long leg 40A and a short leg 40B, and screws 39, with the upper portion of the printed board 36 held close to the inner surface of the leg portion 28 of the cover 23. In this regard, the screws 39 are inserted through apertures 37 and 38 formed in the leg portion 28 and the printed board 36, respectively, to be threaded into threaded holes 41 formed in the short leg 40B of the holder 40. With the arrangement, the display panel 30 is disposed perpendicular to the surface of the printed board 36, of which terminals 42 are electrically connected to terminals 43 of the display panel 30 via the conducting sections 34 of the connector 31. The resilient connector 31 is compressed in the thicknesswise direction of the printed board 36 by driving the screws 39 to produce reaction forces in such direction, as well as in the lengthwise direction of the printed board 36, so that the connector 31 is resiliently brought into close contact with the printed board 36 and the display panel 30 to ensure contact between the conducting sections 34 of the connector 31 and the terminals 42, 43. Such contact pressures are determined by the relationship between the volume of the recess 29 and the volume of the connector 31, and are readily adjusted as by setting appropriate values for the depth of the recess 29 and the width and height of the connector 31.

A shock absorbing material 44 abuts and is interposed between the top surface of the long leg 40A, i.e., the horizontal portion of the holder 40 to support thereon the display panel 30. The shock absorbing material 44 serves to accommodate dispersions and strains involved in the manufacture of the display panel 30 and the holder 40 and to absorb shocks due to inadvertent dropping of the display device. The cover 23, having mounted thereto the display panel 30, connector 31 and printed board 36, is secured to the casing body 22 by fitting the projection 24 thereof onto the stepped portion 25 of the casing body 22. In this position, the leg portion 28 of the cover 23 and the head 39a of the screw 39, received in the counter bore connected to the aperture 37 in the leg portion 28, cooperate to protect the casing body 22 against external forces acting in the direction A, and the vertical surface of the holder 40 protects the casing body 22 against external forces in the direction of B, as shown in FIG. 9. Furthermore, the screws 39 are contained in the casing body 22, so that it is possible to prevent obstacles from occurring in integrated circuits and the like due to static electricity built up when a user touches the display device. In FIGS. 7 and 8, reference numeral 45 designates a cover provided as a part of the casing body 22 for the charging and removing of electric cells.

Thus, according to the invention, the display panel is arranged adjacent to an end of the printed board perpendicularly to the plane of the printed board, so that the display panel can be positioned at a surface of a relatively small area, for example, the top end surface of the casing. This makes it possible for a user to read numerals, characters and the like on the display panel of the display device when the device is worn on the user's clothing. In addition, the casing of the display device is flatter, i.e., thinner, than that shown in the drawings. Moreover, the number of fitting portions exposed outside is reduced, thereby improving the external appearance.

In the above-described embodiment of the invention, the display device is constructed such that the corner portion 30a of the display panel 30 is flush with the terminals 42 of the printed board 36. However, the display panel 30 can be designed to have its corner portion 30a extend into the recess 29 in a manner that the display panel 30 and the printed board 36 are arranged to cooperatively define a T-shaped cross-section. In such a case, the corner portion 30a of the display panel 30 can be accommodated by cutting out an edge portion in the connector 31. Alternatively, the connector 31 may be designed to be hollow in cross-section.

While the display panel is disposed on the top surface of the casing body 21 in the above embodiment, it may alternately be disposed on the bottom surface which is also of a small area. It is to be noted here that characters in addition to numerals can be displayed on the display panel.

What is claimed is:

1. A display device for electrical equipment, said display device comprising: a casing for containing the equipment, said casing having a recess defined along the interior thereof; a transparent plate mounted in said casing; a display panel positioned in the casing inwardly of said transparent plate; a resilient connector which has the form of an elongated rod and is received in the recess formed in said casing; a printed board; and fastening means securely holding said printed board in said casing by, said display panel being disposed adjacent an end of said printed board and extending in the direction perpendicular to the plane of said printed board, said resilient connector serving to electrically connect said printed board to said display panel.

2. A display device as set forth in claim 1, wherein said casing has a flat shape and comprises: a casing body having a top end; and a cover provided at the top end of said casing body and having a top end surface provided with a window and defining a face plate portion, and wherein said transparent plate is mounted in said window provided in the top end surface of said cover.

3. A display device as set forth in claim 2, wherein said cover is provided with a leg portion which is adapted to extend into said casing body and a recess is defined along the interior thereof, and said fastening means comprises a plurality of screws and a holder having a plurality of threaded holes provided therethrough, said screws extending through apertures provided in said leg portion of the cover and in said printed board, respectively, and being threaded thereafter into the threaded holes of said holder, thereby holding said printed board securedly and resiliently contacting said resilient connector with said display panel and said printed board.

4. A display device as set forth in claim 3, wherein said display panel is supported by a shock absorbing material which is interposed between said display panel and said holder.

5. A display device as set forth in claim 3, wherein said screws of said fastening means are contained within said casing.

6. A display device as set forth in claim 1, wherein said resilient connector comprises a central core comprised of a resilient material and an electrically conductive envelope surrounding the central core, the resilient material having a lower hardness than the electrically conductive envelope.

7. A display device as set forth in claim 1, wherein said resilient connector has a channel-shaped cross-section to facilitate its being received in said recess.

8. A display device as set forth in claim 4, wherein said holder has an L-shaped cross-section with a long leg and a short leg, the short leg having said plurality of threaded holes provided therethrough and being secured to said printed board, and the long leg abutting said shock absorbing material and supporting said display panel.

9. A display device as set forth in claim 1, wherein said printed board comprises electric contacts having contact surfaces oriented parallel to said printed board plane and contacting said resilient connector, said display panel comprises electric contacts having contact surfaces oriented transversely to said contact surfaces of said printed board contacts and contacting said resilient connector, and said recess supports said resilient connector along sides of said resilient connector which are directed away from said electric contacts.

* * * * *